Oct. 29, 1957 J. C. ACHENBACH 2,811,636

FREQUENCY CONVERTER AND LOCAL OSCILLATOR WITH SERIES CONNECTED SPACE CURRENT PATHS

Filed July 26, 1954 2 Sheets-Sheet 1

INVENTOR.
John C. Achenbach

BY H. L. Newton

ATTORNEY

Oct. 29, 1957 J. C. ACHENBACH 2,811,636

FREQUENCY CONVERTER AND LOCAL OSCILLATOR WITH SERIES CONNECTED SPACE CURRENT PATHS

Filed July 26, 1954 2 Sheets-Sheet 2

INVENTOR.

John C. Achenbach

BY H. L. Newton

ATTORNEY

United States Patent Office 2,811,636

Patented Oct. 29, 1957

2,811,636

FREQUENCY CONVERTER AND LOCAL OSCILLATOR WITH SERIES CONNECTED SPACE CURRENT PATHS

John C. Achenbach, Haddonfield, N. J., assignor to Radio Corporation of America, a corporation of Delaware Application July 26, 1954, Serial No. 445,505

7 Claims. (Cl. 250—20)

This invention relates to improvements in signal receiving apparatus and more particularly, to frequency converting systems for converting signal modulated radio frequency waves to corresponding signal modulated waves of different frequency.

In superheterodyne receivers, a received signal modulated carrier wave is combined with a locally generated oscillator signal in a suitable signal mixer to produce a fixed intermediate frequency (I. F.) carrier wave having corresponding signal modulation. As the receiver is tuned to receive different frequency carrier waves, the oscillator frequency is changed correspondingly to maintain a constant frequency difference. The resultant I. F. carrier wave is then amplified by a fixed frequency I. F. amplifier and conveyed to suitable utilization circuits.

In general, a certain fixed amount of oscillator signal voltage injection to the signal mixer enables optimum conversion performance in most forms of high frequency mixers. It is difficult to maintain the oscillator signal voltage injection constant as the oscillator frequency is varied over a wide range. The oscillator signal injection to the mixer also varies over long periods of time due to variations in supply potentials, replacement and aging of the oscillator tubes, etc., all of which result in variation in the strength of oscillations generated. Furthermore, during the manufacture of frequency converters differences in the transconductance of oscillator tubes of the same type, together with the variations within the tolerances of the various circuit components used generally requires that the amount of oscillator signal injection be carefully adjusted to insure uniformity of operation between the different frequency converters manufactured. Adjustment of the oscillator signal injection causes undesirable interaction between the oscillator frequency determining circuits and the mixer tuned signal input circuit by changing the loading thereon and hence detuning the circuits.

It is a primary object of this invention to provide a frequency converter for high frequency signal receiving systems having automatic regulation of the oscillator signal injection into the signal mixer circuit at substantially the amount required to provide optimum conversion performance.

It is a further object of this invention to provide an improved frequency converter for radio receivers and the like having substantially uniform oscillator injection to the mixer circuit over a wide range of oscillator frequencies.

It is a still further object of this invention to provide an improved signal mixer for high frequency signal receivers which has uniformity of oscillator signal injection to the mixer circuit with variations in supply potential, aging and replacement of electron tubes etc. between the oscillator and the mixer.

It is another object of this invention to provide an improved frequency converter circuit which may be economically constructed in large quantities with a minimum of circuit adjustment during the manufacturing process yet obtaining uniformly high efficiency of operation.

In accordance with the invention, a mixer tube and an oscillator tube are connected in series between the terminals of a source of polarizing potential so that one tube functions as a variable series voltage dropping resistor for the other tube. A condition of tubes or components which would otherwise result in an abnormally high oscillator voltage on the mixer tube, tends to increase the resistance of the mixer tube with a consequent reduction of oscillator anode to cathode power supply voltage. This results in a reduction of the strength of oscillations in the oscillator tube and tends to reduce the oscillator voltage on the mixer tube to more nearly the designed center value for optimum performance. The converse of this action also takes place in a similar manner if the oscillator tends to be weaker than normal.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1, 2, 3:
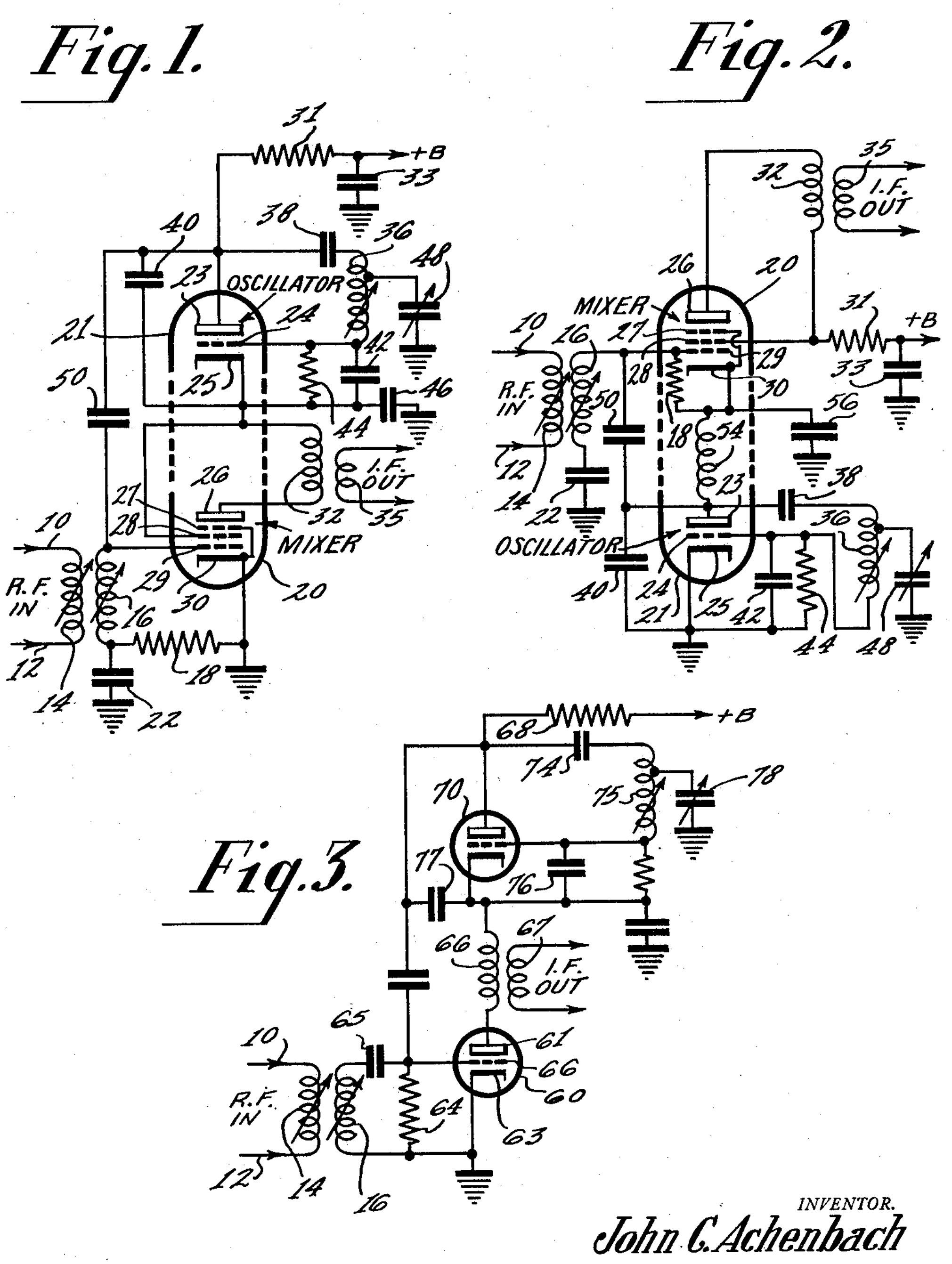
Figure 1 is a schematic circuit diagram of a frequency converter constructed in accordance with the present invention, having separate oscillator and mixer electron tubes enclosed in a single envelope.
Figure 2 is a schematic circuit diagram of a modification of the frequency converter shown in Figure 1 wherein the relative positions of the oscillator and mixer tubes in the series circuit are reversed.
Figure 3 is a schematic circuit diagram of a further modification of the frequency converter shown in Figure 1 having triode mixer and oscillator tubes in separate envelopes.

Referring now to the drawings wherein like reference characters are used to designate like components throughout the various figures thereof, and particularly to Figure 1, a pair of terminals 10 and 12 are connected to a source of signal modulated radio frequency carrier waves (not shown). The terminals 10 and 12 are also connected with a tunable primary winding 14 which, in combination with the distributed capacitance of the windings or other suitable capacitive circuit elements, is tuned to the frequency of the received carrier waves. The received carrier waves are inductively coupled from the primary winding 14 to a tunable secondary winding 16. One side of the secondary winding 16 is connected to the input electrode of a pentode mixer tube 20 which comprises the pentode section of a pentode-triode tube 21 while the other side is connected to ground through a bypass capacitor 22 which has low impedance at the radio frequencies.

The pentode mixer tube 20 has an anode 26, a suppressor grid 27, a screen grid 28, a control grid 29, and a cathode 30. The control grid 28 is connected through the secondary winding 16 of the coupling transformer and the grid-leak resistor 18 to the cathode 30. The cathode 30 and the suppressor grid 27 are directly connected with a point of fixed reference potential or ground.

The anode 26 of the mixer tube 20 is connected to a source of polarizing potential +B through an intermediate frequency transformer primary winding 32, an oscillator tube 21 and a direct current dropping resistor 31. The screen grid 28 is connected directly through the oscillator tube 21 and the direct current dropping resistor 31 to the +B terminal. A signal bypass capacitor 33 is connected between the +B terminal and ground to keep oscillator and signal frequencies out of the power supply. The intermediate frequency transformer primary winding 32 is connected between the mixer anode 26 and the oscillator cathode and is tuned to the intermediate frequency by the distributed capacitance of the windings thereof in combination with the interelectrode and stray capacities of the mixer tube. Intermediate frequency signals developed across the primary winding 32 are coupled to the secondary winding 35 of the intermediate frequency transformer and to a utilization circuit (not shown).

The oscillator tube 21 includes an anode 23, a control grid 24, and a cathode 25. The oscillator is of the Colpitts type and has a tank circuit comprising a variable tuning inductor 36 which resonates with the series combination of the inherent anode to cathode capacitance of the oscillator tube which is supplemented by the parallel connected capacitor 40 and the inherent grid to cathode capacitance as supplemented by the parallel connected capacitor 42. The oscillator tank circuit is connected between the anode 23 and the control grid 24 of the oscillator tube 21 with the cathode 25 connected to the junction of the series capacitors 40 and 42. The use of the supplemental capacitors 40 and 42 is primarily a matter of design depending on the oscillator tube used, the frequency requirements, etc. A grid-leak resistor 44 is connected to provide a direct current path between the control grid 24 and the cathode 25, and a capacitor 46 which has low impedance to signals of the intermediate frequency, is connected between the cathode 25 and ground to maintain the cathode of the oscillator at signal ground potential.

The oscillator anode is connected through the resistor 31 to a source of polarizing potential +B and the blocking capacitor 38 prevents the high voltage from being impressed on the oscillator control electrode. The oscillator main tuning is accomplished by controlling the inductance of the tuning inductor 36 and fine tuning is achieved by variation of the capacitance of a small capacitor 48 which is connected from a point on the inductor 36 to ground.

A portion of the oscillator voltage is taken from the anode 23 of the oscillator tube 21 and fed through a coupling capacitor 50 to the control grid 29 of the mixer tube 20 to provide the heterodyning oscillator signal. The oscillator signal appearing between the anode 23 and cathode 25 of the oscillator tube 21, which is effectively at signal ground potential, appears across the secondary winding 16. The mixer 20 combines the oscillator signal with the received signal modulated radio frequency carrier waves to convert the received waves to a corresponding intermediate frequency signal. The word tube as used herein designates an electron discharge device enclosed in an envelope either by itself or in combination with other tubes.

Referring now to Figure 2, which is a schematic diagram of a modification of the frequency converted system described in Figure 1, the relative positions of the oscillator and mixer sections between the power supply terminals are reversed. The circuits are substantially the same as those shown in Figure 1 and like components are designated by the same reference numerals. The radio frequency carrier wave energy is coupled to the grid 29 of the mixer through the coupling transformer windings 14 and 16. The cathode 30 of the mixer tube 20 is connected through a signal bypass capacitor 56 to ground, thus completing the signal path between the grid 29 and cathode 30 through the secondary winding 16. Since the mixer cathode 30 is at signal ground potential, an inductor 54 is connected between the anode 23 of the oscillator section and the cathode 30 of the mixer section to provide a direct current path between the oscillator anode and the mixer cathode and yet maintain the oscillator anode 23 sufficiently above signal ground potential to sustain oscillations. The oscillator output signal is coupled from the anode 23 of the oscillator tube 21 through the capacitor 50 to the grid 29 of the signal mixer tube 20, and the resultant intermediate frequency signal is developed in the output circuit connected with the mixer anode 26. The direct current path of the oscillator and mixer tubes are in series with the power supply terminal +B which completes the circuit through ground.

Referring now to Figure 3, an embodiment of the invention is shown wherein separate triode tubes are used in the oscillator and mixer circuits and are connected in a manner similar to that described above in connection with Figure 1. The signal modulated radio frequency carrier waves are coupled through the transformer windings 14 and 16 to the input circuit of the mixer tube 60 which includes an anode 61, a control grid 62 and a cathode 63. A grid-leak resistor 64 is connected between the control grid 62 and the cathode 63 to provide a direct current circuit between the grid and the cathode, and a coupling capacitor 65 is serially connected in the connection between the secondary winding 16 and the grid 62. The mixer tube 60 current flows through a series circuit comprising a primary winding 66 of an intermediate frequency transformer; an oscillator tube 70; and a voltage dropping resistor 68 to the source of operating potential +B. The primary winding 66 is tuned by the distributed interelectrode and stray capacities to the intermediate frequency and the intermediate frequency signal developed thereacross is coupled to the secondary winding 67 and then fed to a utilization circuit (not shown).

The oscillator tube 70 which has an anode 71, a control grid 72 and a cathode 73, is connected as a conventional Colpitts oscillator having a variable tuning inductor 75 connected in parallel with the series combination of capacitors including the inherent plate to cathode capacitance of the oscillator tube 70 supplemented by the parallel connected capacitor 77 and the inherent grid to cathode capacitance as supplemented by the parallel connected capacitor 76. The tank circuit is connected between the anode 71 and the control electrode 72 with the cathode 73 being connected to the junction of the series capacitors 76 and 77. A blocking capacitor 74 is provided in the connection between the tuning inductor 76 and the anode 71 to prevent power supply voltage from reaching the control grid 72. A small variable capacitor 78 is connected from a point on the tuning inductor 75 to ground to provide fine tuning of the oscillator frequency. The cathode 73 of the oscillator tube is connected to ground through the signal bypass capacitor 46 to complete the circuit including the fine tuning capacitor 78.

In the operation of the frequency converter described above in connection with Figures 1 through 3, the radio frequency carrier waves, which are coupled through the coupling transformer windings 14 and 16, are impressed between the control electrode and the cathode of the signal mixer tube. Signals from the local oscillation generator are coupled to the mixer tube control grid through a suitable coupling capacitor. The heterodyning action in the mixer tube of the oscillator signal and received radio frequency carrier waves produces the usual heterodyne components including a difference frequency which is developed across the signal output circuit for the frequency converter which includes the primary winding of the intermediate frequency transformer connected with the anode of the mixer.

Since the mixer and oscillator tubes are connected in series across the power supply, the power supply voltage is divided between the tubes as a function of the respective plate resistances. If the tubes or components are such that an abnormally high oscillator voltage would ordinarily be applied to the mixer grid, rectifier action between the control grid and cathode of the mixer tube rectifies the oscillator signal causing a current to flow through the grid-leak resistor. This grid current in the grid-leak resistor develops a bias potential in accordance with the strength of the oscillator signal which changes the operating point of the mixer tube in a direction to increase the anode resistance of the mixer tube. As the mixer anode resistance increases, the anode potential also increases resulting in a consequent reduction in oscillator anode to cathode power supply voltage. Due to the reduction in operating voltage across the oscillator tube, the strength of oscillations will be reduced to more nearly the designed center value for optimum performance.

In large quantity production of a frequency converter of this nature, center values can be chosen within the various tolerances of the different components and after construction of the frequency converter no further adjustment of the coupling between the oscillator and the mixer circuits is required. Since the coupling from the oscillator to the mixer circuits need not be changed, there are no resultant changes in the tuning of the oscillator frequency determining circuit or the mixer tuned signal input circuit, hence the extensive and complicated tuning adjustment associated with adjustment of the coupling circuit are eliminated. Furthermore, since it is difficult to design an oscillator to operate with a constant output potential over a wide frequency range, the automatic regulation of the oscillator signal injection automatically compensates for changes in oscillator output over the frequency range.

Figure 4:
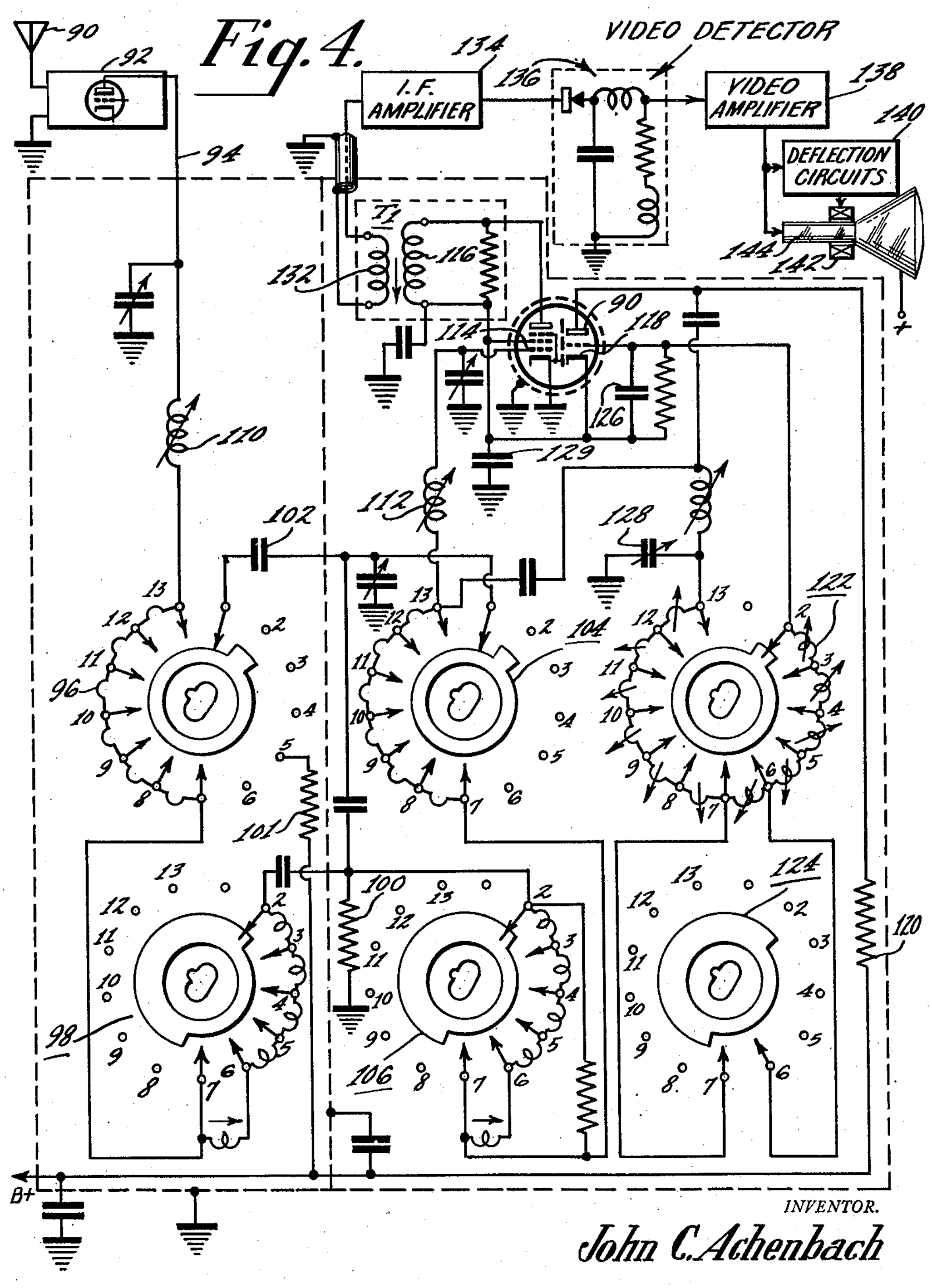
Figure 4 is a schematic circuit diagram partly in block diagram form of a frequency converter system embodying the invention connected for operation with a television receiver.

Referring now to Figure 4, the television signals are received by an antenna 90 and are conveyed to a radio frequency amplifier 92. The radio frequency amplifier 90 includes the usual television tuning elements for selecting predetermined ones of the very high frequency (V. H. F.) television channels. The amplified signals are conveyed through a conductor 94 to ground through the wafer switch sections 96, 98 which include inductors which form part of a first tuned circuit, and the resistor 100. The wafer switch section 96 includes a linear conductor about a portion of the periphery of the wafer switch 96 stator element having a plurality of terminals 7 to 13 thereon with sufficient inductance between the various terminals to selectively tune the channels 7 to 13. The wafer switch section 98, which may physically be constructed on the opposite side of the wafer switch section 96, has a plurality of inductors connected between the various terminals 2 to 7 thereof to tune the television channels 2 to 7. The +B supply for the radio frequency amplifier 90 is connected through a direct current dropping resistor 101 to the terminal number 5 of the wafer switch 96 which is connected directly (not shown) with the terminal number 5 of the wafer switch section 98 and hence through the inductors on the wafer switches to the anode of the R. F. amplifier.

The signals developed across the inductors on the wafer switch sections 96 and 98 are conveyed through a coupling capacitor 102 to a second tuned input circuit comprising inductors carried by the wafer switch sections 104 and 106, which tuned circuit forms part of the input circuit for the signal mixer section of the tube 108. A channel selector switch is provided to move the rotors of the wafer switches in unison and hence connect different amounts of inductance in the circuit to tune the first and second tuned circuits to different ones of the television channels. For example, the switches are shown in the channel 2 position where all of the inductors on the switch sections are utilized. For channel 3 the inductors between the terminals 2 and 3 on the switch sections 98 and 106 respectively are shorted out, for channel 4 the inductors between the terminals 3 and 4 on these switch sections are also shorted out. More and more of the inductors are progressively eliminated until at channel 13 the only inductance remaining in the circuit in addition to the distributed inductance is that presented by the inductors 110 and 112.

The television channel selected by the tuned circuits is fed to the grid 114 of the pentode mixer section of the combined mixer oscillator tube 90. The anode of the mixer section is connected in series through the primary winding 116 of the intermediate frequency transformer $T_1$, the oscillator section of the tube 90 and a D. C. dropping resistor 120 to a source of polarizing potential +B.

The oscillator circuit is tuned by inductors carried by a wafer switch selector 122 having a plurality of terminals 2 to 13 distributed about the periphery thereof with appropriate inductances inserted between the various terminals. For channels 2 to 6, the inductors comprise coils connected between the adjacent terminals and for the channels 7 to 13, the inductors comprise portions of an arcuate linear conductor of suitable length to provide the appropriate inductance. The wafer switch section 124 provides a short-circuiting connection for the inductor connected between terminals 6 and 7 of the wafer section 122 when tuning channels 7 to 13.

The oscillator circuit operates as a Colpitts oscillator and the inductors on the wafer switch 122 are connected in parallel with the series combination of the inherent plate to cathode capacitance of the oscillator section of the tube 90 and the inherent grid to cathode capacitance supplemented by a capacitor 126 connected in parallel therewith. The frequency determining tank circuit is connected between the anode and control grid of the oscillator tube with the cathode 118 being connected at the junction of the series capacitances. A fine tuning capacitor 128 is connected between a point on the frequency determining tank circuit and ground to adjust the tuning of the oscillator slightly, and the cathode of the oscillator section is connected through a bypass capacitor 129 to ground to complete the circuit including the fine tuning capacitor 128. A portion of the oscillator signal is conveyed by a coupling capacitor 130 to the signal input grid 114 of the mixer signal.

The automatic regulation of oscillator injection is achieved by means of the rectifier action on the oscillation signal between the cathode and control electrode of the mixer tube with a resultant bias voltage as explained above in connection with Figures 1 to 3, being developed across the grid-leak resistor 100 which is connected in the direct current path between the control electrode and the cathode of the mixer section. The intermediate frequency output signal which is developed across the primary winding 116 of the intermediate frequency transformer $T_1$ is coupled to a secondary winding 132 which is connected with an intermediate frequency amplifier indicated by the rectangle 134. The intermediate frequency waves after amplification are applied to a video detector illustrated schematically within the dashed rectangle 136. The composite video signal is, after detection, amplified by a video amplifier such as is indicated by the block 138 and applied to the deflection circuit 140 which serves to drive sawtooth deflection currents of horizontal and vertical frequencies through the electromagnetic yoke 142 associated with the television kinescope 144.

In accordance with the foregoing description an improved frequency converter for radio receivers and the like has been provided in which the direct current paths of the oscillator and mixer tubes enables automatic control of oscillator signal injection into the signal mixer circuit.

What is claimed is:

1. A frequency converter for radio receivers and the like for converting a received signal modulated radio frequency carrier wave to corresponding intermediate frequency waves comprising in combination, a signal mixer tube and an oscillator tube, a source of polarizing potential for said tubes, means connecting the space current paths of said mixer tube and said oscillator tube in series with said source of polarizing potential, means providing a low impedance signal current path connected between a point of fixed reference potential for said converter and the portion of said means connecting said mixer tube to said oscillator tube for providing independent signal current paths for said oscillator tube and said mixer tube, a signal input circuit connected with said mixer tube for connection with a source of signal modulated R. F. carrier waves, means providing an oscillator circuit for said oscillator tube, further means providing a coupling connection from said oscillator circuit to said signal input circuit, and an output circuit tuned to the intermediate frequency connected to said frequency converter.

2. A frequency converter for radio receivers and the like, comprising in combination, a signal mixer circuit including a first electron tube having an anode, a cathode, and control electrode, a signal input circuit connected between said control electrode and said cathode for connection with signal modulated radio waves, means connecting said cathode to a point of fixed reference potential for said converter, an oscillation generator including an oscillator tube having an anode, control electrode and a cathode, means connecting said oscillator tube cathode to a point of fixed reference potential for said converter, means providing a coupling connection between said oscillation generator and said signal input circuit, further means connecting the direct current paths of said oscillator and mixer tubes in series, and a signal output circuit connected with said frequency converter.

3. A frequency converter for radio receivers and the like as defined in claim 2, wherein said signal input circuit comprises a tuned circuit having a tunable inductance winding, and said oscillation circuit is correspondingly tunable to maintain a constant frequency difference from said signal input circuit.

4. A frequency converter for radio receivers and the like comprising in combination, a signal mixer circuit including an electron tube having an anode, a cathode and control electrode, a signal input circuit for said mixer circuit, resistive means including a grid-leak resistor providing a direct current path between said control electrode and said cathode, an oscillation generator including an oscillator tube having an anode, control electrode and cathode, a signal bypass capacitor connected between said oscillator tube cathode and ground to maintain said cathode at substantially ground potential for high frequency signals, means providing a coupling connection between said oscillator generator and said signal input circuit, an intermediate frequency output circuit, and means providing a direct current connection between said anode of said mixer tube and the cathode of said oscillator tube including said intermediate frequency output circuit.

5. A frequency converter for radio receivers and the like as defined in claim 4, wherein said intermediate frequency output circuit includes the primary winding of an intermediate frequency transformer.

6. A frequency converter for radio receivers and the like for converting a received signal modulated radio frequency carrier wave to a corresponding intermediate frequency wave comprising in combination, a signal mixer circuit including an electron tube having an anode, a cathode and control electrode, a signal input circuit connected between said control electrode and said cathode for connection with signal modulated radio waves, means comprising a signal bypass capacitor for connecting said cathode to a point of fixed reference potential for said converter, an oscillation generator including an oscillator tube having an anode, control electrode and cathode, means connecting said oscillator tube cathode to a point of fixed reference potential for said converter, means providing a coupling connection between said oscillation generator and said signal input circuit for injecting a predetermined amount of oscillator voltage in said mixer input circuit, further means including an impedance element connected between the anode of said oscillator tube and the cathode of said mixer tube for connecting the direct current paths of said oscillator and mixer tubes in series, a source of polarizing potential connected between the anode of said mixer tube and the cathode of said oscillator tube, and a signal output circuit connected with said frequency converter.

7. In a television receiver the combination with a station selector switch for tuning said receiver to any one of a plurality of V. H. F. television channels of a frequency converter comprising, a signal mixer circuit including an electron tube having an anode, a cathode and a control electrode, means connecting said cathode to ground for said converter, a signal input circuit connected between said control electrode and cathode, said signal input circuit including an inductor controlled by said station selector switch means to tune said signal input circuit to predetermined ones of said television channels, means providing a grid-leak resistor in the direct current path between said control electrode and said cathode, an oscillation generator including an oscillator tube having an anode, a control electrode and a cathode, a signal bypass capacitor connected between said oscillator tube cathode and ground, a tuning inductor for said oscillation generator controlled by said station selector switch means for tuning said oscillation generator to a frequency which differs from the tuned frequency of said input circuit by a predetermined amount, means providing a coupling connection between said oscillation generator and said signal input circuit, an intermediate frequency output circuit including an I. F. transformer having a primary winding, and means connecting the anode of said mixer tube to the cathode of said oscillator tube including the primary winding of said intermediate frequency transformer.

References Cited in the file of this patent

UNITED STATES PATENTS

| | | |
|---|---|---|
| 2,584,850 | De Mers | Feb. 5, 1952 |

FOREIGN PATENTS

| | | |
|---|---|---|
| 409,756 | Great Britain | May 7, 1934 |